(12) United States Patent
Wang et al.

(10) Patent No.: US 11,501,557 B2
(45) Date of Patent: Nov. 15, 2022

(54) DISPLAY APPARATUS AND METHOD FOR MANUFACTURING THE SAME

(71) Applicant: BOE Technology Group Co., Ltd., Beijing (CN)

(72) Inventors: Lei Wang, Beijing (CN); Xiaoliang Ding, Beijing (CN); Yunke Qin, Beijing (CN); Lei Zhang, Beijing (CN); Xiaoquan Hai, Beijing (CN); Mingdong Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/205,050

(22) Filed: Mar. 18, 2021

(65) Prior Publication Data
US 2022/0019756 A1   Jan. 20, 2022

(30) Foreign Application Priority Data

Jul. 20, 2020   (CN) .......................... 202010697324.0

(51) Int. Cl.
*G02F 1/1362* (2006.01)
*G06V 40/13* (2022.01)
*H01L 27/146* (2006.01)
*H01L 27/32* (2006.01)

(52) U.S. Cl.
CPC .... *G06V 40/1318* (2022.01); *H01L 27/14623* (2013.01); *H01L 27/14678* (2013.01); *H01L 27/14685* (2013.01); *H01L 27/3234* (2013.01)

(58) Field of Classification Search
CPC .......... G06V 40/1318; H01L 27/14623; H01L 27/14678; H01L 27/14685; H01L 27/3234; G02F 1/136227; G02F 1/13338
See application file for complete search history.

(56) References Cited

U.S. PATENT DOCUMENTS

| | | | |
|---|---|---|---|
| 10,914,977 B1 * | 2/2021 | Hsu ...................... | G02F 1/13338 |
| 10,962,850 B1 * | 3/2021 | Yang .................. | G02F 1/136227 |
| 2020/0293739 A1 * | 9/2020 | Yang .................. | H01L 27/3234 |

\* cited by examiner

*Primary Examiner* — Abdul-Samad A Adediran
(74) *Attorney, Agent, or Firm* — ArentFox Schiff LLP; Michael Fainberg (57) ABSTRACT

The present disclosure provides a display apparatus and a method for manufacturing the same. The display apparatus includes: a self-luminous display module, a fingerprint identification module below the self-luminous display module, at least two light shield layers between the self-luminous display module and the fingerprint identification module, and a planarization layer correspondingly arranged on one side, facing the self-luminous display module, of each light shield layer. Each light shield layer includes a plurality of mutually-independent openings; openings of one of the at least two light shield layers and openings of another of the at least two light shield layers overlap in a direction perpendicular to the fingerprint identification module; the planarization layer between two adjacent light shield layers includes a groove; and the groove and the openings do not overlap in the direction perpendicular to the fingerprint identification module, and a light blocking part is arranged in the groove.

10 Claims, 7 Drawing Sheets

DISPLAY APPARATUS AND METHOD FOR MANUFACTURING THE SAME

The present application claims the priority of the Chinese patent application No. 202010697324.0 filed to the China Patent Office on Jul. 20, 2020, of which the entire contents are incorporated herein by reference.

FIELD

The present disclosure relates to the technical field of display, in particular to a display apparatus and a method for manufacturing the same.

BACKGROUND

With the high speed development of the information industry, a biological identification technology has been more and more widely applied. Particularly, because different users have different fingerprints, in order to facilitate user identity verification, a fingerprint identification technology has be widely applied to the various fields such as mobile terminals and smart home to provide safety guarantee for users.

Optical fingerprint identification is one of means for realizing fingerprint identification. The principle of the optical fingerprint identification is as follows: when a finger is put above a display product, emitted light rays of a light source contained in the display product irradiate a valley and a ridge of the finger, are reflected by the valley and the ridge of the finger and then enter an optical fingerprint identification device contained in the display product. Generated light currents are different due to different light intensity reflected by the valley and the ridge, so that the optical fingerprint identification device can identify fingerprints according to the light currents.

SUMMARY

An embodiment of the present disclosure provides a display apparatus and a method for manufacturing the same.

A display apparatus includes: a self-luminous display module, a fingerprint identification module located below the self-luminous display module, at least two light shield layers located between the self-luminous display module and the fingerprint identification module, and a planarization layer correspondingly arranged on one side, facing the self-luminous display module, of each light shield layer;

where each light shield layer includes a plurality of mutually independent openings, and openings of one of the at least two light shield layers and openings of another of the at least two light shield layers overlap in a direction perpendicular to the fingerprint identification module; and the planarization layer located between two adjacent light shield layers includes a groove; and the groove and the openings do not overlap in the direction perpendicular to the fingerprint identification module, and a light blocking part is arranged in the groove.

In some embodiments, the groove penetrates through the planarization layer.

In some embodiments, a depth of the groove is smaller than a thickness of the planarization layer in the direction perpendicular to the fingerprint identification module.

In some embodiments, the groove is fully filled with a light shield layer to serve as the light blocking part.

In some embodiments, the groove is filled with a light shield layer and the planarization layer arranged corresponding to the light shield layer where the groove is located; and in the groove, the light shield layer is close to an inner wall of the groove relative to the planarization layer, and the light shield layer in the groove serves as the light blocking part.

In some embodiments, the fingerprint identification module includes a plurality of photosensitive devices; and an orthographic projection of each photosensitive device on the light shield layers corresponds to the plurality of openings.

In some embodiments, the self-luminous display module is an organic light-emitting display module.

Based on the same inventive concept, an embodiment of the present disclosure further provides a method for manufacturing the display apparatus, including:

providing a fingerprint identification module;

sequentially and alternately forming a light shield layer including a plurality of mutually independent openings and a first planarization layer provided with a groove on the fingerprint identification module, until forming a preset layer number of light shield layers; where the groove and the plurality of openings do not overlap in a direction perpendicular to the fingerprint identification module;

forming a second planarization layer on the light shield layers; and providing a self-luminous display module, and attaching the self-luminous display module to the second planarization layer.

In some embodiments, the forming the light shield layer including the plurality of mutually independent openings, includes:

forming a light shield material layer;

exposing the light shield material layer by taking a first mask plate as shielding; and developing the exposed light shield material layer, developing off an unexposed light shield material layer for forming the plurality of mutually independent openings, and retaining the exposed light shield material layer for forming the light shield layer.

In some embodiments, the forming the first planarization layer provided with the groove, where the groove and the plurality of openings do not overlap in the direction perpendicular to the fingerprint identification module, includes:

forming a light-transmitting material layer on the light shield layer; exposing the light-transmitting material layer by taking a second mask plate as shielding; and developing the exposed light-transmitting material layer, developing off the exposed light-transmitting material layer for forming the groove which is not overlapped with the plurality of openings, and retaining an unexposed light-transmitting material layer for forming the first planarization layer.

DETAILED DESCRIPTION OF THE EMBODIMENTS

In order to make the objective, technical solutions and advantages of the embodiments of the present disclosure clearer, the technical solutions of the embodiments of the present disclosure will be described clearly and completely with reference to the drawings of the embodiments of the present disclosure. The sizes and shapes of all graphs in the drawings do not reflect the true scale, and only intend to illustrate the content of the present disclosure. The same or similar reference numbers represent the same or similar elements or elements with the same or similar functions from beginning to end. Obviously, the described embodiments are part of the embodiments of the present disclosure, but not all the embodiments. On the basis of the described embodiments of the present disclosure, all other embodiments obtained by a person of ordinary skill in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The words "first", "second" and the like used in the specification and claims of the present disclosure do not indicate any order, quantity or importance, but are only used to distinguish different components. The word "including" or "comprising" and the like, means that an element or item preceding the word comprises an element or item listed after the word and the equivalent thereof, without excluding other elements or items. The words "inner", "outer", "up", "down" and the like are only used to indicate the relative positional relationship. When the absolute position of the described object changes, the relative positional relationship may also change accordingly.

Figure 1:
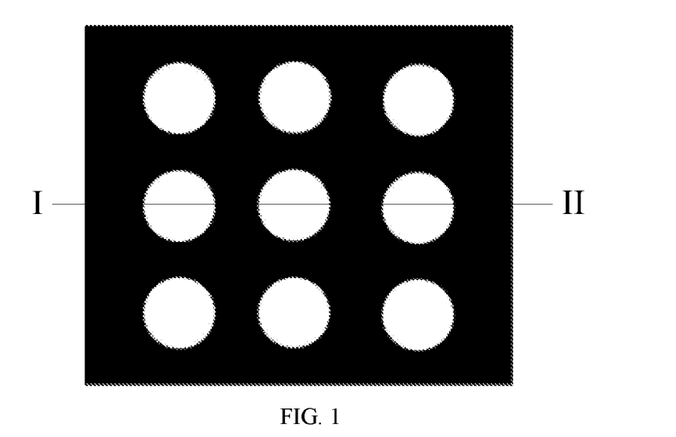
FIG. 1 is a schematic top view of a display apparatus in the related art.
Figure 2:
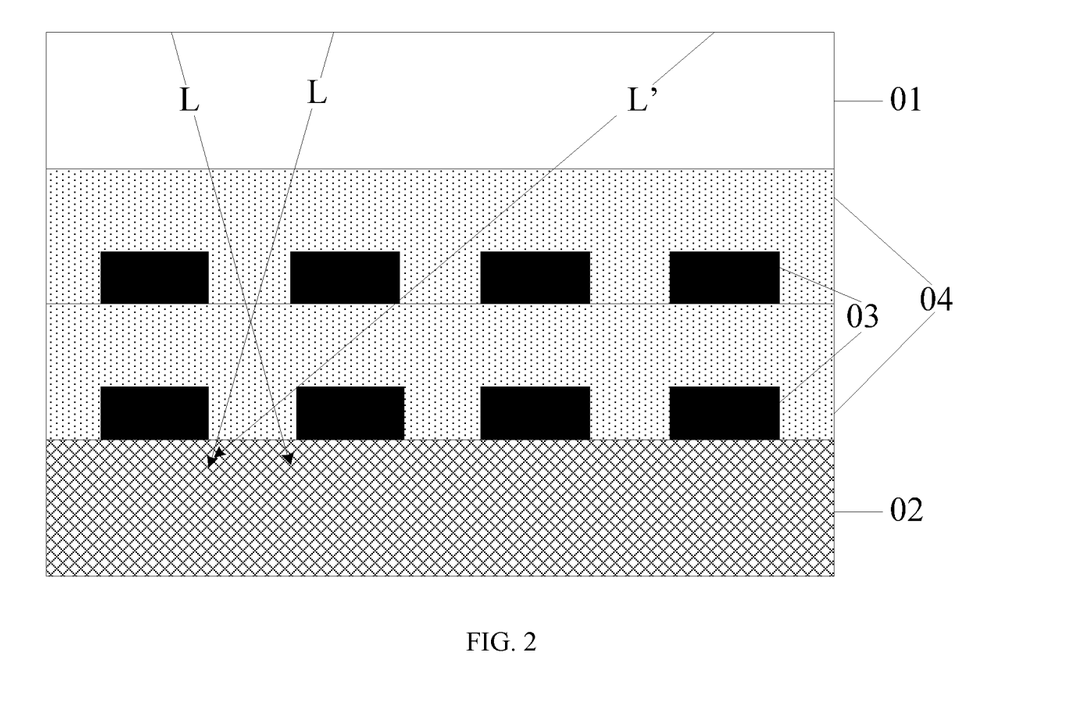
FIG. 2 is a schematic diagram of a sectional structure along a line I-II in FIG. 1.

As shown in FIG. 1 and FIG. 2, in the related art, a display product having a fingerprint identification function includes a self-luminous display module 01, a fingerprint identification module 02 located below the self-luminous display module 01, and light shield layers 03 and planarization layers (PLN) 04 which are alternately arranged between the self-luminous display module 01 and the fingerprint identification module 02. Where the light shield layers 03 are internally provided with mutually-overlapped openings to constitute a sleeved hole collimation structure. In a fingerprint identification procedure, light rays L reflected by a finger are irradiated to the fingerprint identification module through the sleeved hole collimation structure to realize fingerprint imaging. However, a certain gap exists between adjacent light shield layers 03, large-angle light rays L' entering the sleeved hole collimation structure penetrate through the gap to reach the adjacent sleeved hole collimation structure, so as to form crosstalk on a collimation light path at the adjacent sleeved hole collimation structure, thereby resulting in fingerprint fuzziness.

Aiming at solving the problem existing in the related art, embodiments of the present disclosure provide a display apparatus, which may be any products or components, having a display function, such as a mobile phone, a tablet computer, a television, a displayer, a notebook computer, a digital photo frame, a navigator, a smartwatch, a fitness wristband and a personal digital assistant.

Figure 3:
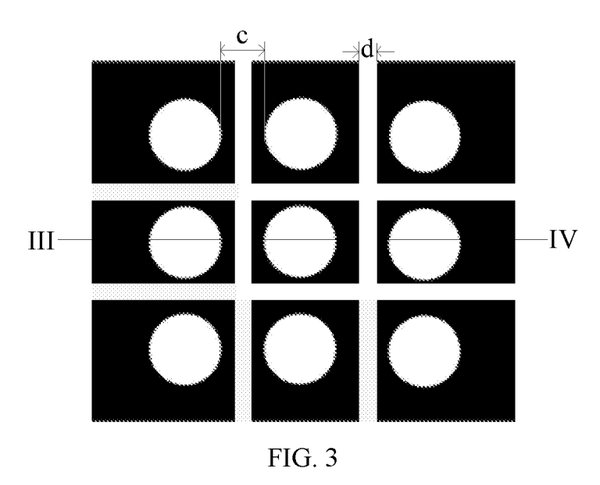
FIG. 3 is a schematic top view of a display apparatus provided by an embodiment of the present disclosure.
Figure 4:
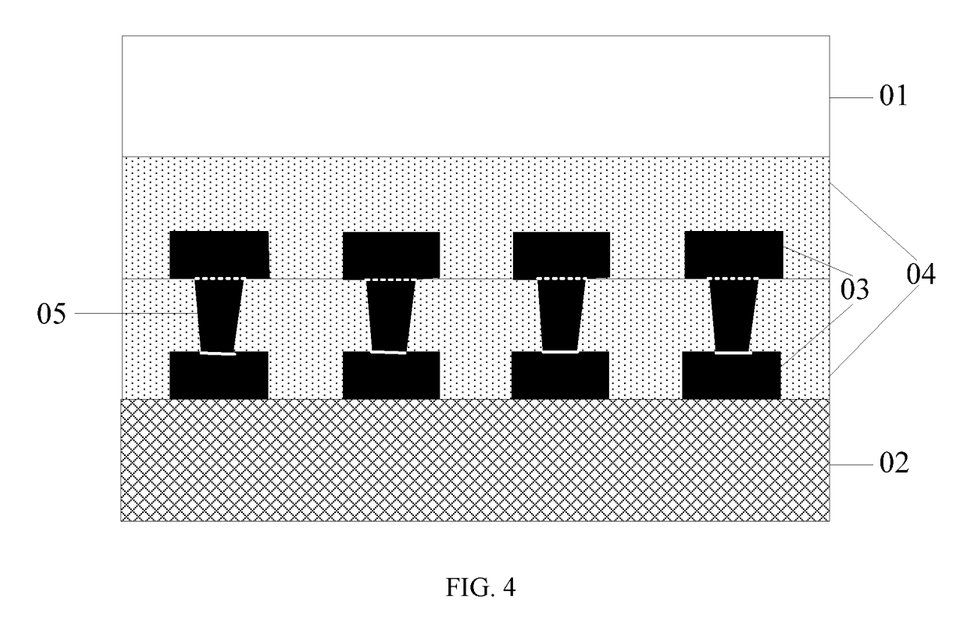
FIG. 4 is a schematic diagram of a sectional structure along a line III-IV in FIG. 3 of a display apparatus provided by an embodiment of the present disclosure.

Specifically, the display apparatus provided by the embodiment of the present disclosure, as shown in FIG. 3 and FIG. 4, includes: a self-luminous display module 01, a fingerprint identification module 02 located below the self-luminous display module 01, at least two light shield layers 03 located between the self-luminous display module 01 and the fingerprint identification module 02, and a planarization layer 04 correspondingly arranged on one side, facing the self-luminous display module 01, of each light shield layer 03.

Each light shield layer 03 includes a plurality of mutually-independent openings, and openings of one of the at least two light shield layers 03 and openings of another of the at least two light shield layers (for example, all the light shield layers 03) overlap in a direction perpendicular to the fingerprint identification module 02.

The planarization layer 04 located between two adjacent light shield layers 03 includes at least one groove; and at least one groove and the openings do not overlap in the direction perpendicular to the fingerprint identification module 02, and a light blocking part 05 is arranged in each of the at least one groove.

In the display apparatus provided by the embodiment of the present disclosure, by forming the grooves which are not overlapped with the openings in the planarization layers 04 between the adjacent light shield layers 03 and arranging the light blocking parts 05 in the grooves, crosstalk light between the adjacent openings is shielded by the light blocking parts 05, transmittance of the large-angle crosstalk light is reduced, the collimation angles of the light rays transmitting through the sleeved hole collimation structure of the plurality of light shield layers 03 are smaller, thereby improving the accuracy of fingerprint identification, and the fingerprint image effect is better.

It should be noted that the design of graphs needing to be exposed of the planarization layers 04 and the effect of the grooves formed after developing are different according to different opening arrangement modes and size specifications in the light shield layers 03. For example, the light shield layers 03 in FIG. 3 include the plurality of openings arranged in an array, and at the moment, the grooves are in a grid shape extending in a crossed mode in a transverse direction and a longitudinal direction.

It should be noted that in the display apparatus provided by the embodiment of the present disclosure, the mutually overlapped openings contained in all the light shield layers 03 constitute the plurality of sleeved hole collimation structures. In order to not influence the effect of all the sleeved hole collimation structures, it should be ensured that the light shield layers 03 around the openings may be supported by the planarization layers 04. In order to achieve the supporting effect, the grooves do not overlap with the openings, that is, a width d of each groove should be smaller than a distance c between the openings, as shown in FIG. 3. Specifically, the reduced size is related to the process capability.

Figure 5:
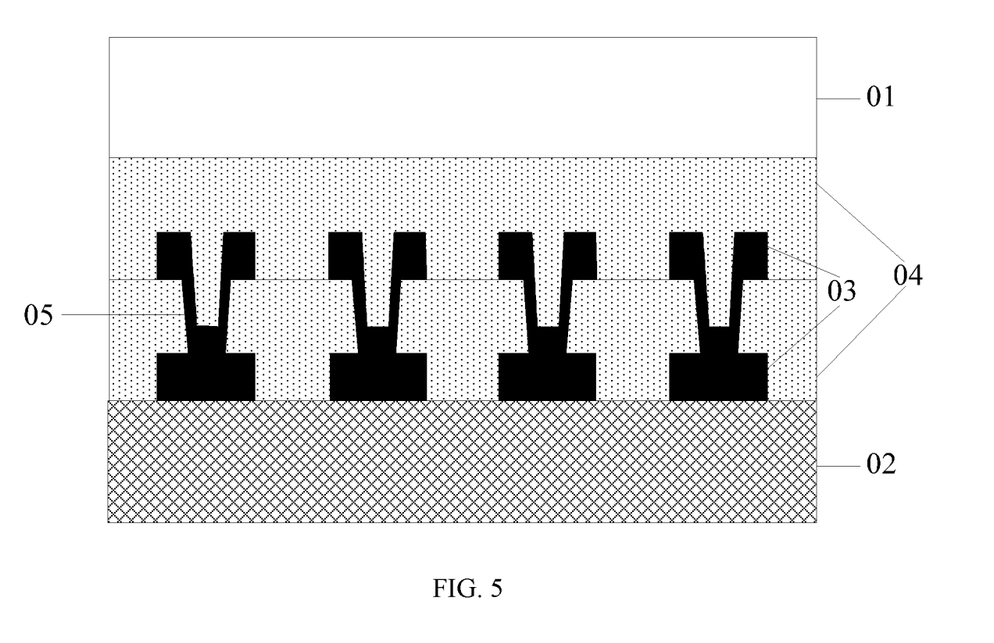
FIG. 5 is a schematic diagram of another sectional structure along the line III-IV in FIG. 3 of a display apparatus provided by an embodiment of the present disclosure.
Figure 6:
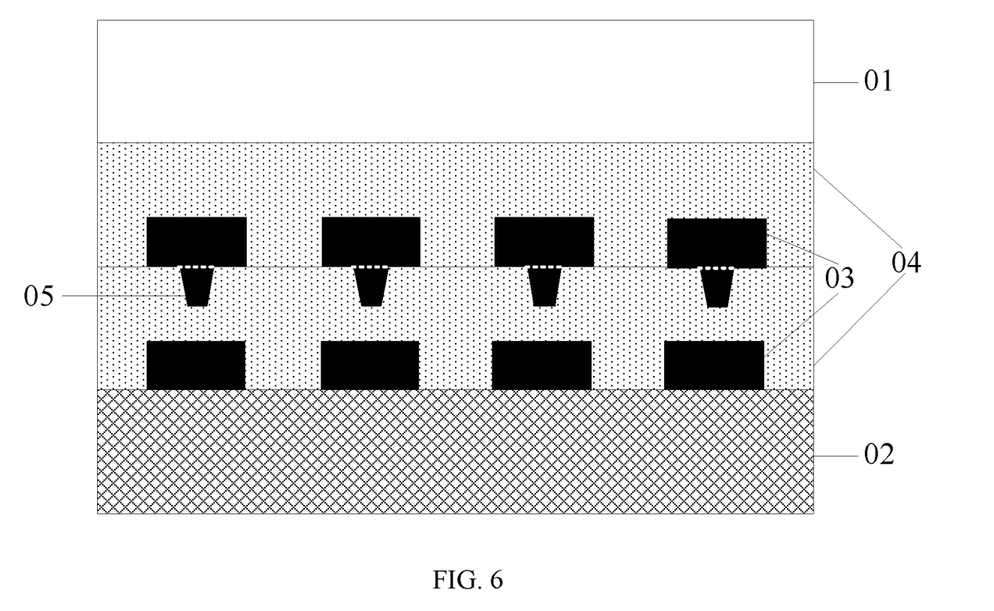
FIG. 6 is a schematic diagram of a further sectional structure along the line III-IV in FIG. 3 of a display apparatus provided by an embodiment of the present disclosure.

In the display apparatus provided by the embodiment of the present disclosure, the size of d will influence the shape of the grooves after exposing and developing. Under the condition that the size of d is large, the grooves formed after exposing and developing the planarization layers 04 are normal, specifically as shown in FIG. 4 and FIG. 5, and the grooves may penetrate through the planarization layers 04. However when d is small, incomplete exposing may appear, specifically as shown in FIG. 6, and the depth of each groove will be smaller than the thickness of the planarization layer 04 in the direction perpendicular to the fingerprint identification module 02.

In the display apparatus provided by the embodiment of the present disclosure, when the thickness of each light shield layer 03 is fixed, the size of each groove will influence a filling mode of the light shield layers 03 internally. Specifically, in FIG. 4, the size of each groove is moderate, and each groove is fully filled with the light shield layer 03 to serve as a light blocking part 05. In FIG. 5, the size of each groove is large, the light shield layers 03 will collapse in the grooves, and thus each groove is filled with the light shield layer 03 and the planarization layer 04 arranged corresponding to the light shield layer 03 where the groove is located; and specifically, in each groove, the light shield layer 03 is close to the inner wall of the groove relative to the planarization layer 04, and the light shield layer 03 in the groove serves as the light blocking part 05. In FIG. 6, the size of each groove is small, and the groove is fully filled with the light shield layer 03 to serve as the light blocking part 05.

It should be noted that in all the above embodiments, the light shield layers 03 filling the grooves serve as the light blocking parts 05 so as to simplify a manufacturing process. In other embodiments, a mask process can further be added to from light blocking parts 05, which is not limited here.

In the display apparatus provided by the embodiment of the present disclosure, the fingerprint identification module 02 includes a plurality of photosensitive devices.

An orthographic projection of each photosensitive device on the light shield layers 03 corresponds to the plurality of openings, that is, the photosensitive devices and the openings in the light shield layers 03 are in one-to-many corresponding relation. Specifically, pixel per inch (PPI) of the fingerprint identification module 02 may be between 200 and 600. In addition, each photosensitive device may be a PIN photosensitive device including a P-type semiconductor layer, an intrinsic semiconductor layer and an N-type semiconductor layer. Generally, the fingerprint identification module 02 may further include a base substrate configured to bear the plurality of photosensitive devices and a driving circuit located between the base substrate and the plurality of photosensitive devices. The base substrate may be a rigid substrate such as glass, and may also be a flexible substrate such as polyimide (PI). The driving circuit may be an active driving circuit (APS) or a passive driving circuit (PPS), and transistors contained in the driving circuit are amorphous silicon (a-Si) transistors, low temperature poly-silicon (LTPS) transistors or oxide transistors.

In the display apparatus provided by the embodiment of the present disclosure, the self-luminous display module 01 may be an organic light-emitting display module (OLED) or a quantum dot light-emitting display module (QLED).

Based on the same inventive concept, embodiments of the present disclosure provide a method for manufacturing a display apparatus. Because the problem solving principle of the manufacturing method is similar to that of the display apparatus, implementation of the manufacturing method provided by the embodiment of the present disclosure may refer to that of the display apparatus provided by the embodiment of the present disclosure, which will not be repeated any more.

Specifically, the method for manufacturing the display apparatus provided by the embodiment of the present disclosure, includes the following steps:

a fingerprint identification module is provided;

a light shield layer including a plurality of mutually independent openings and a first planarization layer provided with grooves are sequentially and alternately formed on the fingerprint identification module, until forming the preset layer number of the light shield layers; wherein the grooves and the plurality of openings do not overlap in a direction perpendicular to the fingerprint identification module;

a second planarization layer is formed on the light shield layers; and a self-luminous display module is provided, and attached to the second planarization layer.

Figure 7:
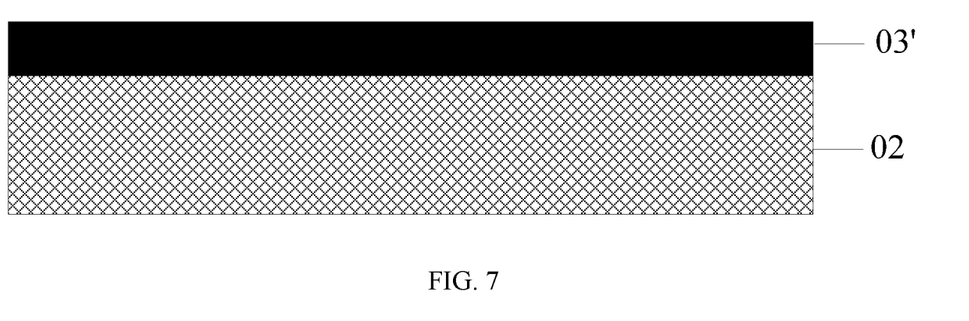
FIG. 7 is a first schematic structural diagram of a display apparatus provided by an embodiment of the present disclosure in a manufacturing procedure.
Figure 8:
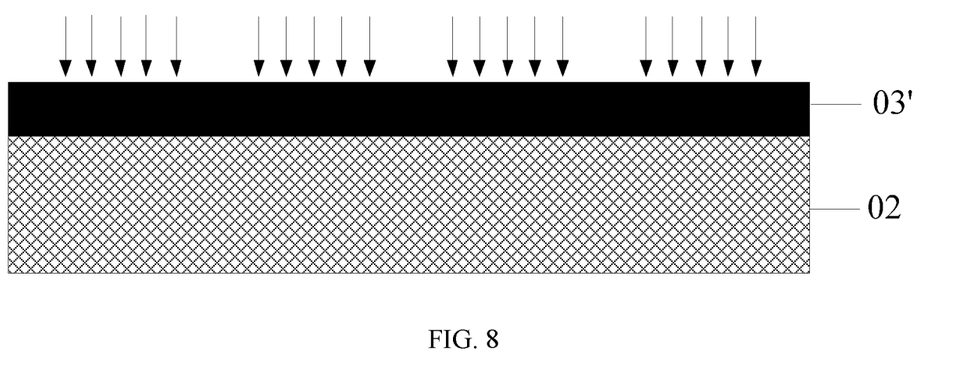
FIG. 8 is a second schematic structural diagram of a display apparatus provided by an embodiment of the present disclosure in a manufacturing procedure.
Figure 9:
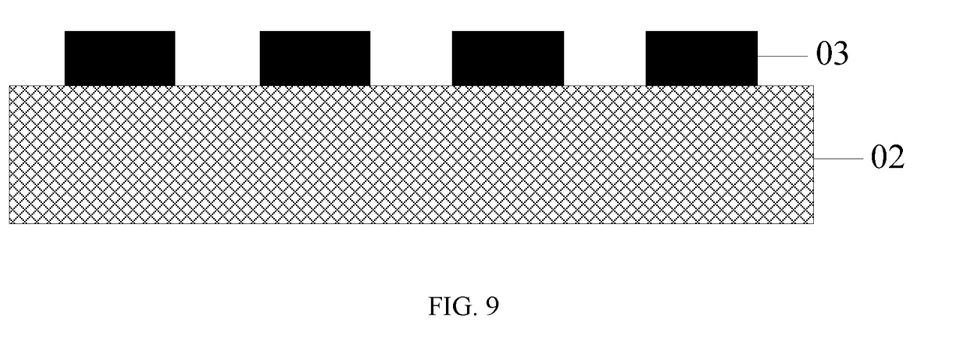
FIG. 9 is a third schematic structural diagram of a display apparatus provided by an embodiment of the present disclosure in a manufacturing procedure.

In the manufacturing method provided by the embodiment of the present disclosure, the step of forming the light shield layer including the plurality of mutually independent openings, may specifically include the following steps:

a light shield material layer 03' is formed, as shown in FIG. 7;

the light shield material layer 03' is exposed by taking a first mask plate as shielding, as shown in FIG. 8; and the exposed light shield material layer 03' is developed, the unexposed light shield material layer 03' is developed off for forming the plurality of mutually independent openings, and the exposed light shield material layer 03' is retained for forming the light shield layer 03, as shown in FIG. 9.

Specifically, the light shield material layer 03' may be a black matrix (BM) material commonly used in a light-emitting display (LCD) color film. The BM is a light-sensitive material, therefore, wet etching or dry etching is not needed, and a process is simple.

Figure 10:
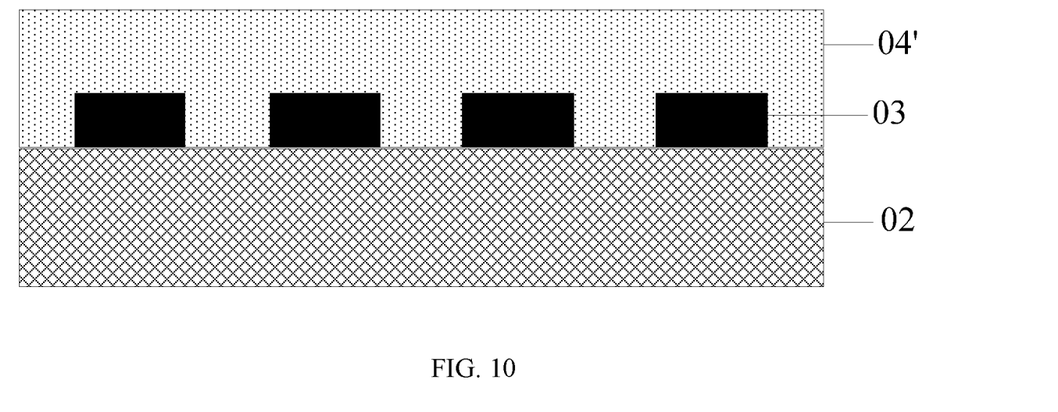
FIG. 10 is a fourth schematic structural diagram of a display apparatus provided by an embodiment of the present disclosure in a manufacturing procedure.
Figure 11:
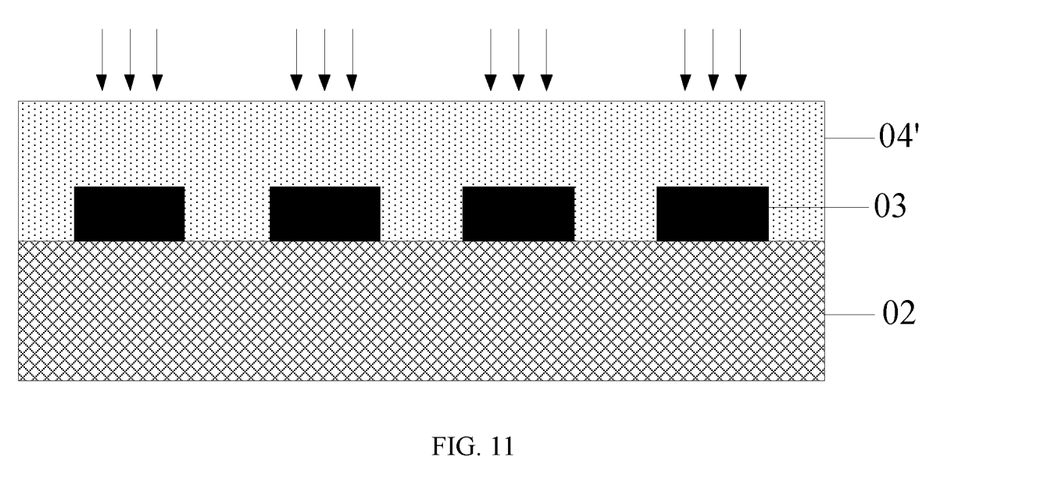
FIG. 11 is a fifth schematic structural diagram of a display apparatus provided by an embodiment of the present disclosure in a manufacturing procedure.
Figure 12:
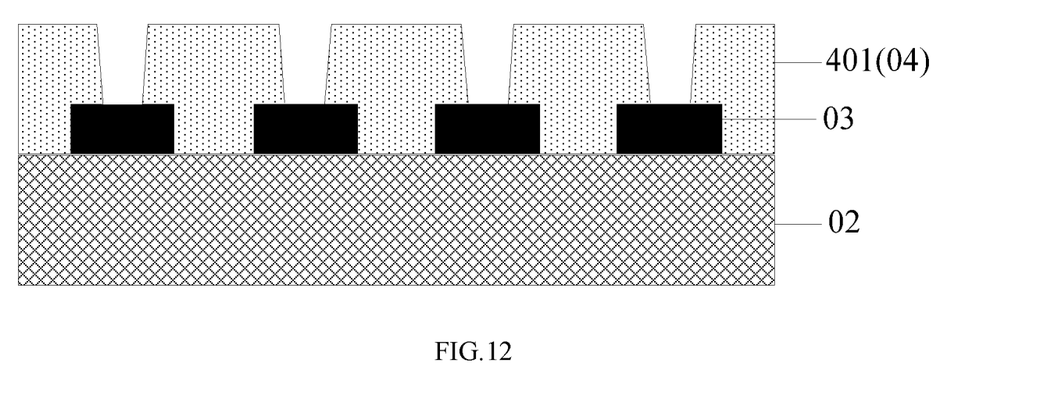
FIG. 12 is a sixth schematic structural diagram of a display apparatus provided by an embodiment of the present disclosure in a manufacturing procedure.

In the manufacturing method provided by the embodiment of the present disclosure, the step of forming the first planarization layers provided with the grooves, wherein the grooves and the plurality of openings do not overlap in the direction perpendicular to the fingerprint identification module, may specifically include the following steps:

a light-transmitting material layer 04' is formed on the light shield layer 03, as shown in FIG. 10;

the light-transmitting material layer 04' is exposed by taking a second mask plate as shielding, as shown in FIG. 11; and the exposed light-transmitting material layer 04' is developed, the exposed light-transmitting material layer 04' is developed off for form the grooves which are not overlapped with the plurality of openings and the unexposed light-transmitting material layer 04' is retained for forming a first planarization layer 401, as shown in FIG. 12.

Specifically, the light-transmitting material layer 04' may be light-transmitting resin, for example, materials of film layers such as a planarization layer and a pixel definition layer (PDL) commonly used in an OLED structure. The PLN and PDL are light-sensitive materials, therefore, wet etching or dry etching is not needed, and a process is simple.

Figure 13:
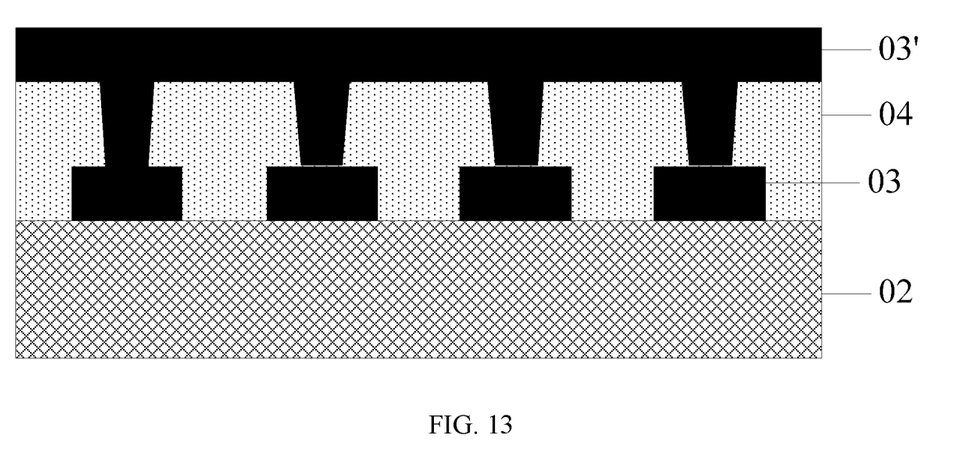
FIG. 13 is a seventh schematic structural diagram of a display apparatus provided by an embodiment of the present disclosure in a manufacturing procedure.
Figure 14:
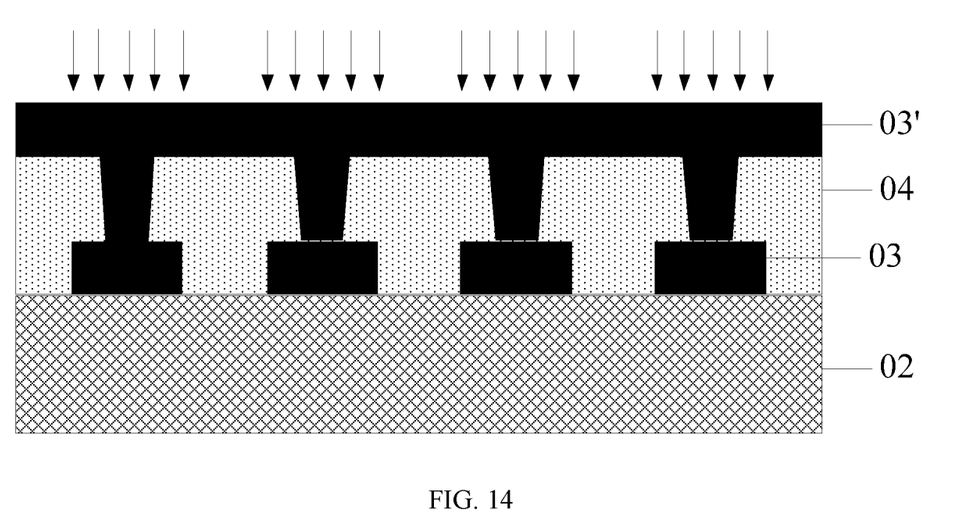
FIG. 14 is an eighth schematic structural diagram of a display apparatus provided by an embodiment of the present disclosure in a manufacturing procedure.
Figure 15:
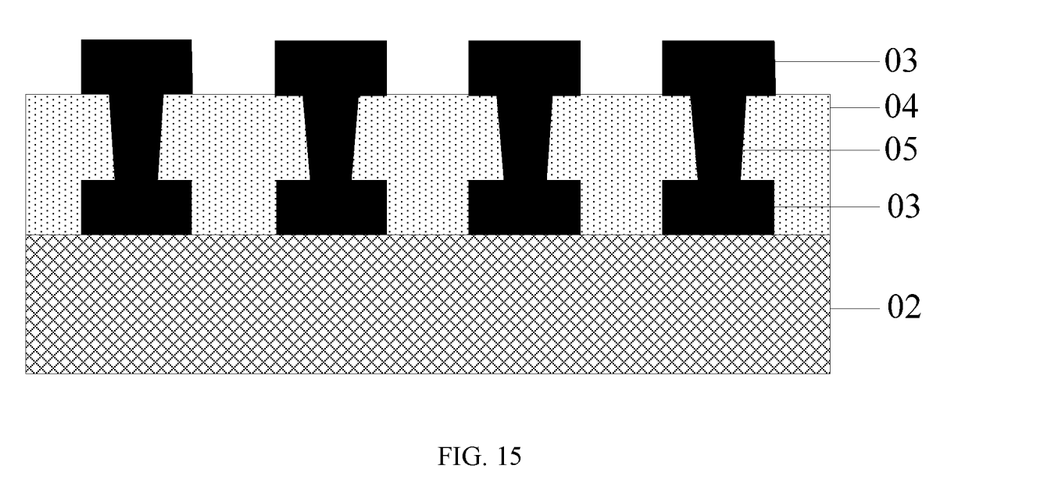
FIG. 15 is a ninth schematic structural diagram of a display apparatus provided by an embodiment of the present disclosure in a manufacturing procedure.

It should be understood that at least two light shield layers 03 should be arranged in order to form the sleeved hole collimation structure in the disclosure. Therefore, after the first planarization layer 401 is manufactured through the above specific steps, the light shield layer 03 may further be continuously manufactured on the first planarization layer 401 by continuously adopting the aforementioned specific implementation of the light shield layer 03, as shown in FIGS. 13-15. In addition, after the required number of the light shield layers 03 are manufactured, a planarization layer 04 (namely, the second planarization layer) may further be manufactured on the light shield layer 03 on the top layer, and the planarization layer 04 is not internally provided with grooves, so as to ensure the subsequent flatness of the surface attached to the self-luminous display module 01, as shown in FIG. 4.

It's worth noting that during specific implementation, the openings in all the light shield layers 03 are the same in arrangement mode, however, in a surrounding area of all the openings, patterns of the different light shield layers 03 may be the same or may be different. In the present disclosure, description is made under the condition that the patterns of the different light shield layers 03 are identical, therefore, all the light shield layers 03 are manufactured through the same mask plate (namely a first mask plate). When the patterns of the different light shield layers 03 are different in the surrounding area of all the openings, the patterns of the corresponding light shield layers 03 should be manufactured through different mask plates.

The display apparatus and the method for manufacturing the same provided by the embodiments of the present disclosure, include: the self-luminous display module, the fingerprint identification module located below the self-luminous display module, at least two light shield layers located between the self-luminous display module and the fingerprint identification module, and the planarization layer correspondingly arranged on one side, facing the self-luminous display module, of each light shield layer. Each light shield layer includes: the plurality of mutually independent openings, and the openings of all the light shield layers overlap in the direction perpendicular to the fingerprint identification module; and the planarization layer located between the two adjacent light shield layers includes: the grooves, the grooves and the openings do not overlap in the direction perpendicular to the fingerprint identification module, and the light blocking part is arranged in each groove. By forming the grooves which are not overlapped with the openings in the planarization layer between the adjacent light shield layers and arranging the light blocking part in each groove, the crosstalk light between the adjacent openings is shielded by the light blocking part, transmittance of the large-angle crosstalk light is reduced, the collimation angles of the light rays transmitting through the sleeved hole collimation structure of the plurality of light shield layers are smaller, thereby improving the accuracy of fingerprint identification, and the fingerprint image effect is better.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display apparatus, comprising:
   a self-luminous display module;
   a fingerprint identification module arranged below the self-luminous display module;
   at least two light shield layers between the self-luminous display module and the fingerprint identification module; and
   a planarization layer correspondingly arranged on one side, facing the self-luminous display module, of each of the light shield layers;
   wherein:
   each of the light shield layers comprises a plurality of mutually independent openings;
   openings of one of the at least two light shield layers and openings of another of the at least two light shield layers overlap in a direction perpendicular to the fingerprint identification module;
   the planarization layer between two adjacent light shield layers of the at least two light shield layers comprises a groove; and
   the groove and the openings of each of the light shield layers do not overlap in the direction perpendicular to the fingerprint identification module, and a light blocking part is arranged in the groove.

2. The display apparatus according to claim 1, wherein the groove penetrates through the planarization layer.

3. The display apparatus according to claim 1, wherein a depth of the groove is smaller than a thickness of the planarization layer in the direction perpendicular to the fingerprint identification module.

4. The display apparatus according to claim 2, wherein the groove is fully filled with a light shield layer to serve as the light blocking part.

5. The display apparatus according to claim 2, wherein the groove is filled with a light shield layers and the planarization layer arranged corresponding to the light shield layer in the groove; and
   the light shield layer in the groove is close to an inner wall of the groove relative to the planarization layer, and the light shield layer in the groove serves as the light blocking part.

6. The display apparatus according to claim 1, wherein the fingerprint identification module comprises a plurality of photosensitive devices; and
   an orthographic projection of each of the plurality of photosensitive devices on the at least two light shield layers corresponds to the plurality of openings.

7. The display apparatus according to claim 1, wherein the self-luminous display module is an organic light-emitting display module.

8. A method for manufacturing a display apparatus, comprising:
   providing a fingerprint identification module;
   sequentially and alternately forming a plurality of light shield layers each comprising a plurality of mutually independent openings and a plurality of first planarization layers each provided with a groove on the fingerprint identification module, until forming a preset layer quantity of light shield layers; wherein the groove and the plurality of openings do not overlap in a direction perpendicular to the fingerprint identification module;

forming a second planarization layer on one, arranged on a top layer, of the plurality of light shield layers;

providing a self-luminous display module; and attaching the self-luminous display module to the second planarization layer.

9. The method according to claim 8, wherein forming any one of the plurality of light shield layers comprising the plurality of mutually independent openings, comprises:

forming a light shield material layer;

exposing the light shield material layer by taking a first mask plate as shielding; and developing the exposed light shield material layer, developing off an unexposed light shield material layer for forming the plurality of mutually independent openings, and retaining the exposed light shield material layer for forming the any one light shield layer.

10. The method according to claim 9, wherein forming any one of the plurality of first planarization layers provided with the groove, wherein the groove and the plurality of openings do not overlap in the direction perpendicular to the fingerprint identification module, comprises:

forming a light-transmitting material layer on the any one light shield layer except for the one light shield layer on the top layer;

exposing the light-transmitting material layer by taking a second mask plate as shielding; and developing the exposed light-transmitting material layer, developing off the exposed light-transmitting material layer for forming the groove which is not overlapped with the plurality of openings, and retaining an unexposed light-transmitting material layer for forming the any one first planarization layer.

* * * * *